United States Patent
Kim et al.

(10) Patent No.: US 7,106,001 B2
(45) Date of Patent: Sep. 12, 2006

(54) DUAL-TYPE ORGANIC ELECTROLUMINESCENT DISPLAY DEVICE AND METHOD FOR MANUFACTURING THE SAME

(75) Inventors: Hyung Wook Kim, Busan (KR); Tae Seung Kim, Busan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 200 days.

(21) Appl. No.: 10/624,597

(22) Filed: Jul. 23, 2003

(65) Prior Publication Data

US 2004/0119407 A1 Jun. 24, 2004

(30) Foreign Application Priority Data

Jul. 23, 2002 (KR) .................. 10-2002-0043271

(51) Int. Cl.
*H01J 1/62* (2006.01)
(52) U.S. Cl. ..................................... 313/512
(58) Field of Classification Search ........ 313/504–512; 428/690
See application file for complete search history.

(56) References Cited

U.S. PATENT DOCUMENTS 6,744,197 B1 * 6/2004 Park et al. ................. 313/504

2002/0057565 A1 5/2002 Seo

FOREIGN PATENT DOCUMENTS

| JP | 62-180986 | 8/1987 |
|----|-----------|--------|
| JP | 63-64082 | 3/1988 |
| JP | 10-255974 | 9/1998 |
| JP | 2000-058260 | 2/2000 |
| JP | 2000-58260 | 2/2000 |
| JP | 2000-100558 | 4/2000 |
| JP | 2000-100560 | 4/2000 |
| JP | 2001-332392 | 11/2001 |
| JP | 2002-158088 | 5/2002 |
| KR | 2003048230 A * | 6/2003 |
| WO | 01/44866 A1 | 6/2001 |

OTHER PUBLICATIONS

Search Report issued in European Patent Application No. 03254625.1 on Jul. 18, 2005.

* cited by examiner

*Primary Examiner*—Joseph Williams
(74) *Attorney, Agent, or Firm*—Stein, McEwen & Bui, LLP

(57) ABSTRACT

A dual-type organic EL device and a method of manufacturing the same. The dual-type organic electroluminescent display (EL) device includes a main organic EL display panel having a main substrate and a main organic EL portion formed on the main substrate, a sub organic EL display panel having a sub substrate and a sub organic EL portion formed on the sub substrate, and a sealing member sealing the main substrate and the sub substrate to each other, wherein the main organic EL portion and the sub organic EL portion are hermetically sealed facing each other.

34 Claims, 6 Drawing Sheets

DUAL-TYPE ORGANIC ELECTROLUMINESCENT DISPLAY DEVICE AND METHOD FOR MANUFACTURING THE SAME

CROSS-REFERENCE TO RELATED APPLICATIONS

This application claims the benefit of Korean Application No. 2002-43271, filed Jul. 23, 2002, in the Korean Intellectual Property Office, the disclosure of which is incorporated herein by reference.

BACKGROUND OF THE INVENTION

1. Field of the Invention

The present invention relates to an organic electroluminescent (EL) display device, and, more particularly, to a dual-type organic electroluminescent display device having two organic EL display panels.

2. Description of the Related Art

In general, electroluminescent display devices, which are spontaneous emission display devices for emitting light by exciting fluorescent organic compounds, have advantageous features such as a low driving voltage, and being thin and light. Also, much attention has been paid to electroluminescent display devices because they have advantageous features suitable for the next generation of display devices that can overcome several problems with LCDs, such as a wide viewing angle and a high response speed.

An organic electroluminescent display device (to be abbreviated as an organic EL device, hereinafter) basically operates as follows. When power is supplied, current flows while electrons migrate. At a negative electrode, the electrons move to an emitting layer through an electron transport layer. At a positive electrode, holes move to the emitting layer through a hole transport layer. The electrons and holes combine at the emitting layer, made of an organic material, to generate excitons having a high energy. The organic material constituting the emitting layer is capable of achieving a display of various colors, according to the organic electroluminescent material used.

In recent years, dual-type display devices have been increasingly demanded by users because they are capable of simultaneously displaying two picture screens in a folder-type electronic device such as a cellular phone.

For instance, referring to FIG. 1, a dual-type organic EL device includes a main organic EL display panel 10 and a sub organic EL display panel 20 coupled to each other so as to be viewed through the front and rear surfaces of the device.

In the dual-type organic EL device, the main organic EL display panel 10 includes a substrate 11, an organic EL portion 12 formed on the substrate 11, a cap 14 for protectively surrounding the organic EL portion 12, an absorbent 15 arranged in the cap 14, and a polarization plate 16 installed on one plane of the substrate 11. The sub organic EL display panel 20 coupled to the main organic EL display panel 10 has substantially the same configuration as that of the main organic EL display panel 10, and includes a substrate 21, an organic EL portion 22, a cap 23, an absorbent 24 and a polarization plate 25.

In the dual-type organic EL device, a user can selectively use information displayed on either the front panel or the rear panel, that is, either the main organic EL display panel 10 or the sub organic EL display panel 20. The dual-type organic EL device can be applied to, for example, a folder-type electronic device.

Another example of the dual-type organic EL device is shown in FIG. 2. Referring thereto, the dual-type organic EL device includes projections 32 and 42, of caps 31 and 41 of a main organic EL display panel 30 and a relatively smaller sub organic EL display panel 40, that are alternately disposed so that the overall thickness of the dual-type organic EL device is reduced.

In the dual-type organic EL device, when the cap 31 of the main organic EL display panel 30 contacts the cap 41 of the sub organic EL display panel 40, the organic EL device becomes bulky due to the heights of the cap 31 and 41 of the respective panels 30 and 40. Thus, there is still a limitation in thinning the dual-type organic EL device.

FIG. 3 shows still another example of a dual-type organic EL device, in which an organic EL display panel 50 and a liquid crystal display (LCD) panel 60 are coupled to each other.

Japanese Patent Publication No. 2000-58260 discloses a bilateral emission type EL device, which is configured such that a cathode electrode, made of a metal having a low work function, is interposed between two EL material layers, and respective transparent electrodes are installed on each of the upper and lower surfaces of the EL material layers. The disclosed device, however, has a problem in that arrangement of an absorbent for protecting the EL material layers against moisture is very difficult work.

Japanese Patent Publication No. Hei 10-255974 discloses a bi-directionally driven organic EL device. The disclosed organic EL device includes a pair of electrodes, at least one of which is transparent or semi-transparent, a host emission layer, which emits light by recombination of holes and electrons injected from both electrodes and made of an organic fluorescent material, and a pair of carrier transport layers disposed between the host emission layer and each of the electrodes, capable of transporting the holes and electrons injected from the respective electrodes and effectively confining the holes and electrons in the host emission layer, and which transmits light at the maximum area of the emitted light.

Also, Japanese Patent Publication No. 2001-332392 discloses a bilateral emission type EL device. The disclosed device includes organic layers having an electron transport layer, an organic emitting layer and a hole transport layer stacked between an opaque cathode and a transparent anode, and a transparent member provided at least at one portion of the opaque cathode as a light guide portion.

As described above, in the bilateral emission type organic EL device having the above-described configuration, an image is formed by a cathode and anode with organic layers interposed therebetween. Thus, a dual image display cannot be achieved.

SUMMARY OF THE INVENTION

Accordingly, it is an aspect of the invention to provide a dual-type organic EL device which can independently display an image on each of both surfaces thereof, and can reduce the thickness thereof.

It is another aspect of the invention to provide a dual-type organic EL device which can extend the lifetime thereof by preventing moisture from infiltrating into organic layers thereof.

It is still another aspect of the invention to provide a dual-type organic EL device with enhanced structural strength by increasing a supporting force in a gap between front and rear substrates when adhered to each other.

Additional aspects and advantages of the invention will be set forth in part in the description which follows and, in part, will be obvious from the description, or may be learned by practice of the invention.

The foregoing and/or other aspects of the present invention are achieved by providing a dual-type organic electroluminescent display (EL) device comprising a main organic EL display panel having a main substrate and a main organic EL portion formed on the main substrate, a sub organic EL display panel having a sub substrate and a sub organic EL portion formed on the sub substrate, and a sealing member sealing the main substrate and the sub substrate to each other, wherein the main organic EL portion and the sub organic EL portion are hermetically sealed facing each other.

The dual-type organic EL device may further comprise a spacer member provided on at least one of facing surfaces of the main and sub organic EL panels, maintaining a gap between the main and sub organic EL display panels and increasing the structural strength thereof.

The area of the main organic EL portion may be greater than that of the sub organic EL portion.

The spacer member may be provided on the sub substrate other than the sub organic EL portion.

The dual-type organic EL device may further comprise an absorbing unit preventing moisture from infiltrating into the main and sub organic EL portions, the absorbing unit provided in a sealed area defined by the sealing member.

The absorbing unit may include an absorbent in a recess formed in at least one portion of either the main substrate or the sub substrate in the sealed area defined by the sealing member, and a porous tape adhered to the substrate having the recess, for preventing outflow of the absorbent.

The absorbing unit may be in the shape of a sheet.

Also, passivation layers covering the main organic EL portion and the sub organic EL portion may be provided on the main substrate and the sub substrate, respectively.

In accordance with another aspect of the present invention, there is provided a dual-type organic electroluminescent display (EL) device comprising a main organic EL display panel comprising a transparent main substrate, a first electrode formed on the transparent main substrate in a predetermined pattern, a first insulation layer pattern defining a predetermined light emitting area, organic layers formed over the first electrode and the first insulation layer in a predetermined pattern, and a second electrode having a predetermined pattern in a direction orthogonal to the first electrode; a sub organic EL display panel comprising a transparent sub substrate, a third electrode formed on the transparent sub substrate in a predetermined pattern, a second insulation layer pattern defining a predetermined light emitting area, organic layers formed over the third electrode and the second insulation layer in a predetermined pattern, and a fourth electrode having a predetermined pattern in a direction orthogonal to the third electrode; and a sealing member sealing the main substrate and the sub substrate to each other, wherein the main organic EL portion and the sub organic EL portion are hermetically sealed facing each other.

The dual-type organic EL device may further comprise a spacer member provided on at least one of facing surfaces of the main and sub organic EL panels, maintaining a gap between the main and sub organic EL display panels and increasing the structural strength thereof.

The area of the main organic EL portion may be greater than that of the sub organic EL portion. The spacer member may be provided on the sub substrate other than the sub organic EL portion.

The spacer member may be integrally formed with at least one of the first and second insulation layers.

The dual-type organic EL device may further comprise an absorbing unit preventing moisture from infiltrating into the main and sub organic EL portions, the absorbing unit provided in a sealed area defined by the sealing member.

The absorbing unit may include an absorbent in a recess formed in at least one portion of either the main substrate or the sub substrate in the sealed area defined by the sealing member, and a porous tape adhered to the substrate having the recess, preventing outflow of the absorbent.

The absorbing unit may be in the shape of a sheet.

Also, passivation layers for covering the main organic EL portion and the sub organic EL portion may be provided on the main substrate and the sub substrate, respectively.

In accordance still another aspect of the present invention, there is provided a method of manufacturing a dual-type organic EL device comprising preparing a main organic EL display panel including the sub-operations of forming a first electrode on a transparent main substrate in a predetermined pattern, forming a first insulation layer pattern defining a predetermined light emitting area, forming organic layers over the first electrode and the first insulation layer in a predetermined pattern, and forming a second electrode having a predetermined pattern in a direction orthogonal to the first electrode; preparing a sub organic EL display panel including the sub-operations of forming a third electrode on a transparent sub substrate in a predetermined pattern, forming a second insulation layer pattern defining a predetermined light emitting area, forming organic layers over the third electrode and the second insulation layer in a predetermined pattern, and forming a fourth electrode having a predetermined pattern in a direction orthogonal to the third electrode; and sealing the main substrate and the sub substrate to each other, wherein the main organic EL portion and the sub organic EL portion are hermetically sealed facing each other.

The method may further comprise aging the main organic EL display panel and the sub organic EL display panel.

Also, the method may further comprise providing a spacer member on at least one of facing surfaces of the main and sub organic EL panels, the spacer member maintaining a gap between main and sub organic EL panels and increasing the structural strength thereof.

The method also may further comprise providing an absorbing unit, the absorbing unit preventing moisture from infiltrating into the main and sub organic EL portions. The absorbing unit may be in the shape of a sheet.

The method may further comprise providing passivation layers covering the main organic EL portion and the sub organic EL portion on the main substrate and the sub substrate, respectively.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
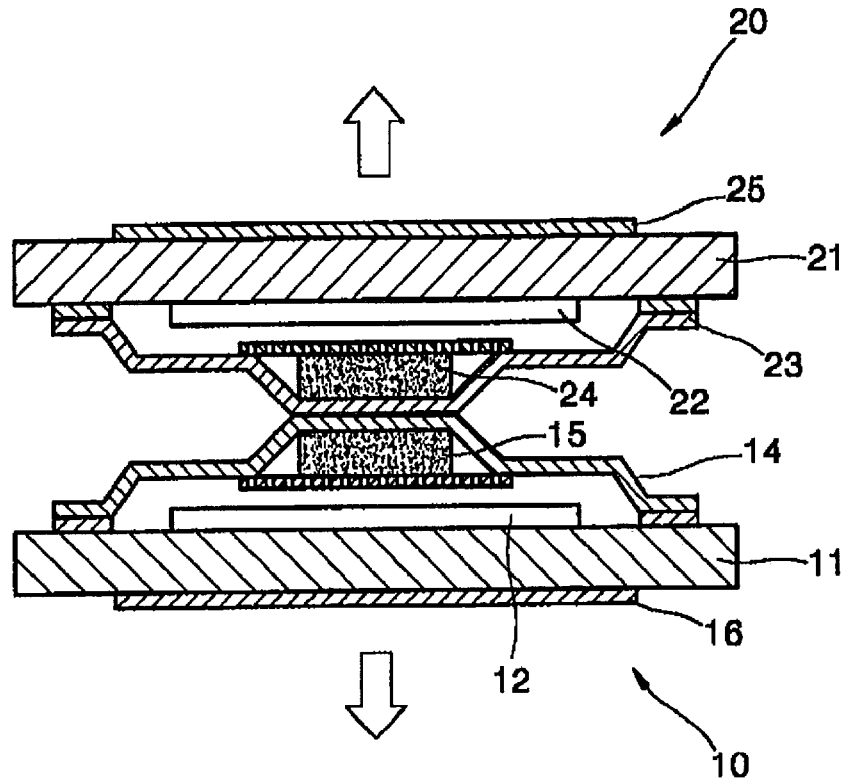
FIG. 1 is a cross-sectional view of a conventional dual-type organic EL device.
Figure 2:
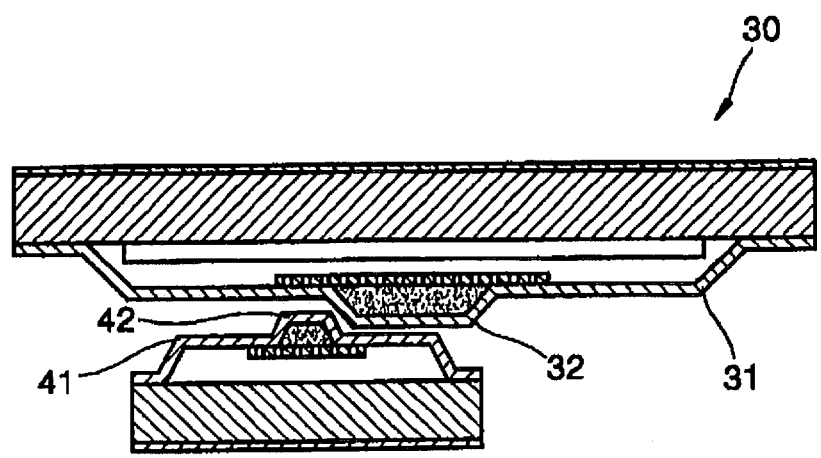
FIGS. 2 and 3 are cross-sectional views showing other examples of conventional dual-type organic EL devices.
Figure 3:
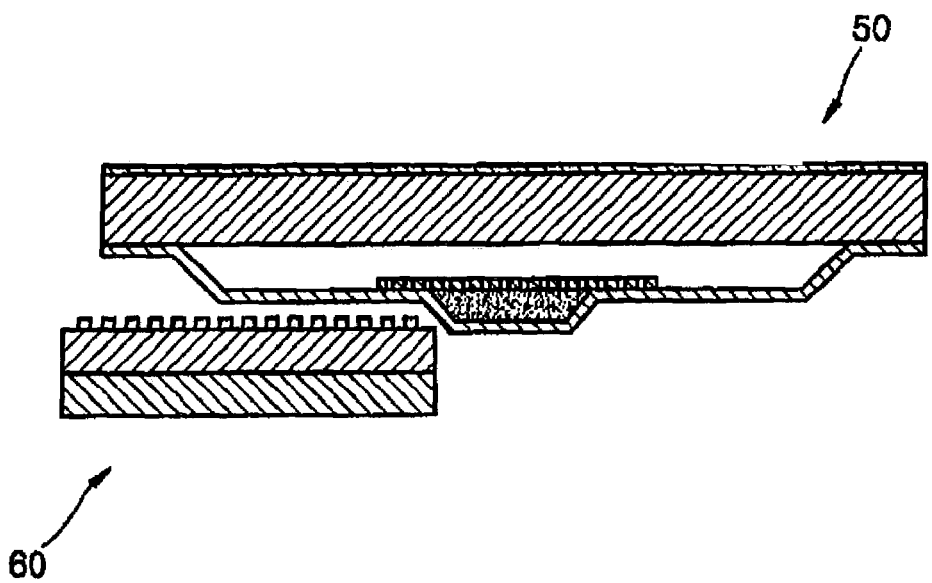

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 4:
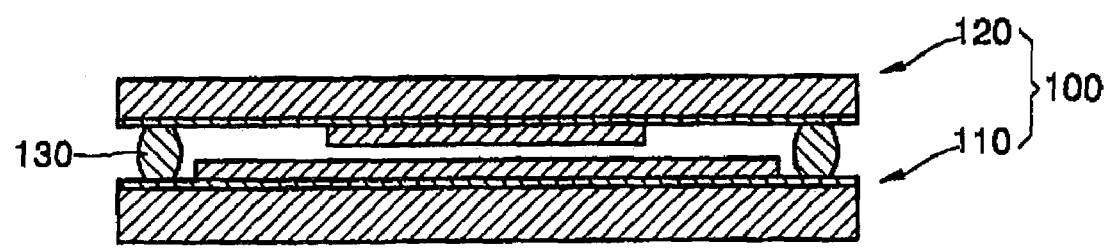
FIG. 4 is a cross-sectional view of a dual-type organic EL device according to an embodiment of the present invention.
Figure 5:
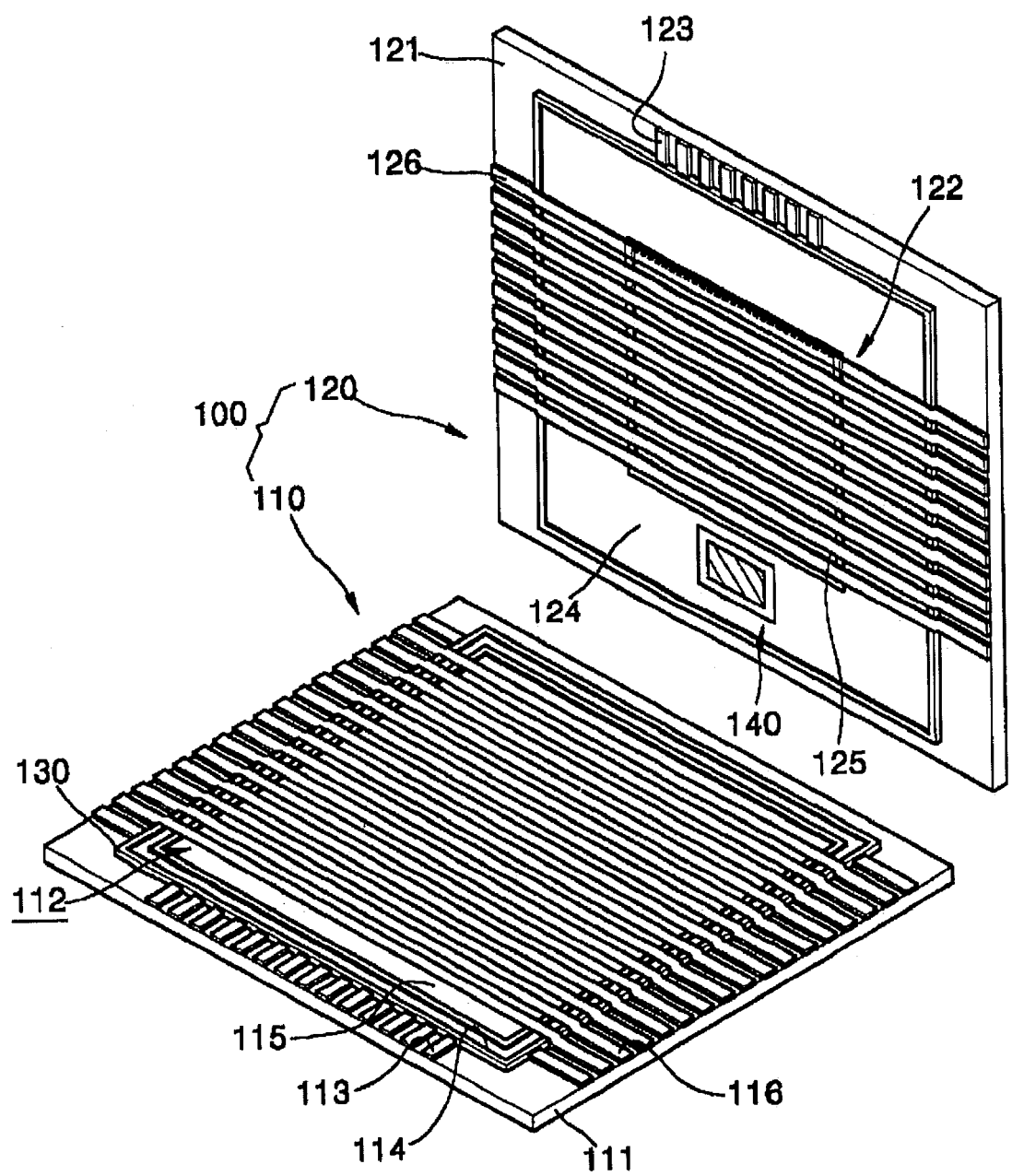
FIG. 5 is a partially perspective view of the organic EL device shown in FIG. 4.

FIGS. 4 and 5 show examples of an organic EL device according to an embodiment of the present invention. Referring to FIG. 4, a dual-type organic EL device 100 includes a main organic EL display panel 110 and a sub organic EL display panel 120. A sealing member 130 hermetically seals the sub organic EL display panel 120 and the main organic EL display panel 110 to each other at both edges, thereby allowing the operation of simultaneously displaying independent images on the two panels.

The main organic EL display panel 110 includes a main substrate 111 and a main organic EL portion 112 formed on the main substrate 111. The main substrate 111 is made of a transparent material for transmitting light formed by the main organic EL portion 112, or dark tint glass for increasing contrast. The main organic EL portion 112 includes a first electrode 113 formed on the main substrate 111, a first insulation layer 114 formed to expose the first electrode 113 in a predetermined pattern so as to form a pixel on the main substrate 111 having the first electrode 113, a first organic layer (not shown) formed over the first insulation layer 114 and the first electrode 113, and a second electrode 116 formed on the first organic layer in a predetermined pattern.

The sub organic EL display panel 120 includes a sub substrate 121, and a sub organic EL portion 122 formed on the sub substrate 121. The sub organic EL display panel 120 has substantially the same configuration as that of the main organic EL portion 112. In other words, the sub organic EL portion 122 includes a third electrode 123 formed on the sub substrate 121, a second insulation layer 124 formed to expose the third electrode 123 in a predetermined pattern so as to form a pixel on the sub substrate 121, a second organic layer (not shown) formed over the second insulation layer 124 and the third electrode 123, and a fourth electrode 126 formed on the second organic layer in a predetermined pattern.

The sealing member 130, for sealing the sub organic EL display panel 120 and the main organic EL display panel 110 that are to be adhered to each other, is applied to edges of the main and sub organic EL display panels 110 and 120 so that the main and sub organic EL portions 112 and 122 may not be exposed to outside elements, thereby preventing infiltration of moisture. The height (or thickness) of the sealing member 130, applied for sealing the main and sub organic EL portions 112 and 122, is preferably as small as possible for effectively suppressing infiltration of moisture.

Figure 6:
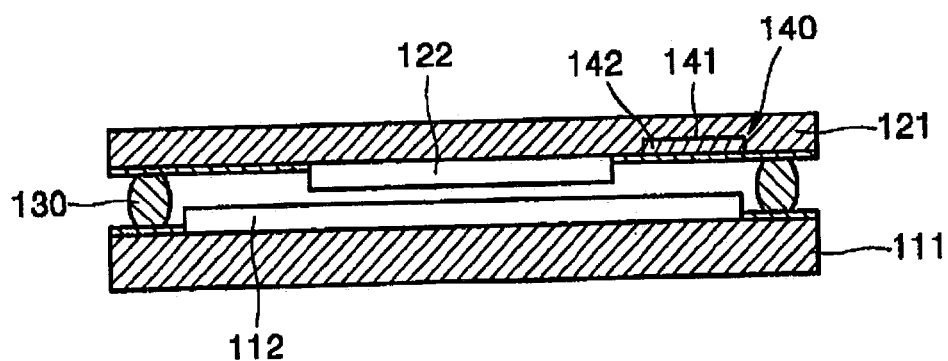
FIGS. 6 through 10 are cross-sectional views illustrating examples of dual-type organic EL devices according to embodiments of the present invention.

As shown in FIGS. 5 and 6, an absorbing unit 140, for preventing damage of the first and second organic layers 115 and 125 of the main and sub organic EL portions 112 and 122 due to moisture infiltrated through the sealing member 130, is installed inside a sealed area defined by the sealing member 130.

The absorbing unit 140 may be installed in the main substrate 111 or the sub substrate 121. As shown in FIG. 6, a recess 141 is formed at the peripheral portion of the sub substrate 121 having the sub organic EL portion 122 that is relatively smaller than the main organic EL portion 122, and the recess 141 is filled with an absorbent 142, e.g., glyceryl dioleate (GDO). A porous tape is adhered to the recess 141 for preventing outflow of the absorbent 142. The absorbing unit 140 is not limited to that illustrated in the above-described embodiment, that is, any structure capable of absorbing moisture, while not causing damage to organic EL portions, can be adopted. For example, the absorbing unit 140 may be in the shape of a sheet adhered to the recess 141.

Figure 7:
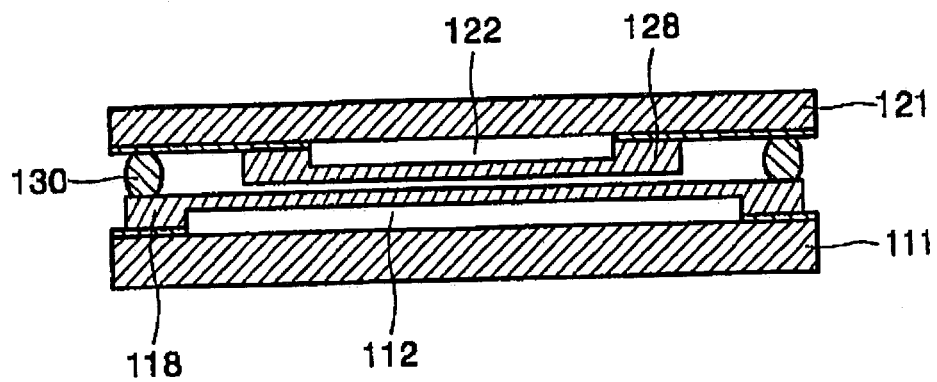
Figure 8:
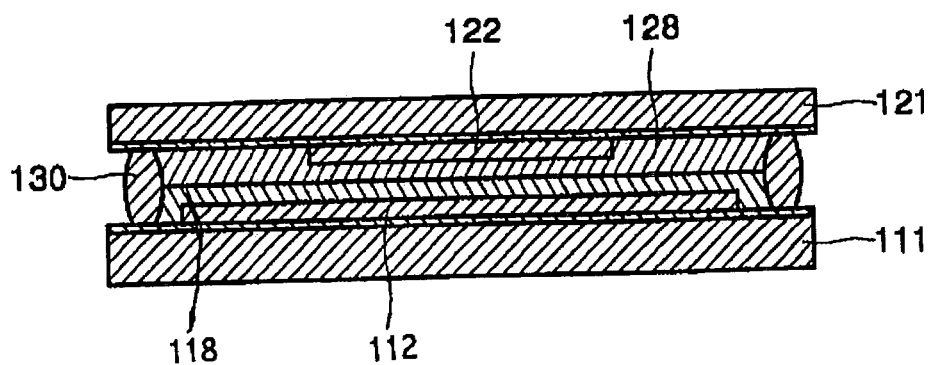

In order to protect the main and sub organic EL portions 112 and 122, as shown in FIG. 7, passivation layers 118 and 128 can be provided. In this case, an absorbent sheet (not shown) is preferably installed between the passivation layers 118 and 128. As shown in FIG. 8, preferably, the passivation layers 118 and 128, covering the main and sub organic EL portions 112 and 122, are closely adhered to each other or integrally formed to remove a space therebetween and then are sealed by the sealing member 130 at edges thereof.

Figure 9:
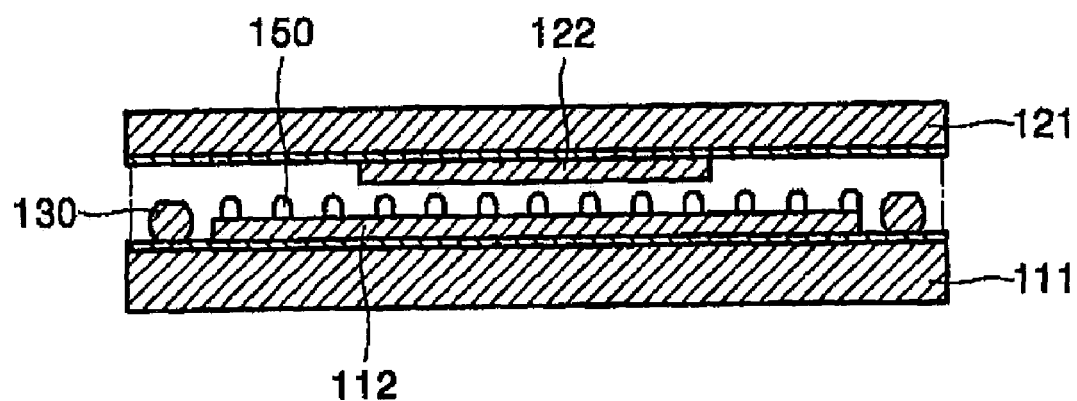

In order to increase the structural strength of the main and sub organic EL display panels 110 and 120, sealed to each other by the sealing member 130, against external force, as shown in FIG. 9, a spacer member 150 is formed on at least one of facing surfaces of the main and sub organic EL panels 110 and 120. More specifically, the spacer member 150 is formed on the first or second insulation layer (not shown) of the main or sub organic EL panel 110, 120, that is, on an area other than the organic EL portion 112, 122. The spacer member 150 may be incorporated into the first and second insulation layer.

Figure 10:
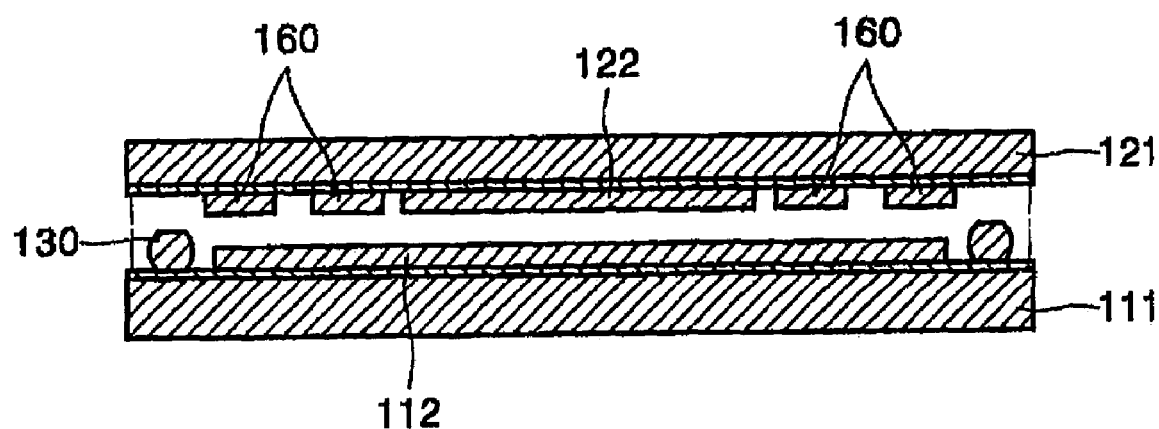

FIG. 10 shows another example of a spacer member. Referring thereto, the spacer 160 formed is formed on an area of the substrate 121 other than the sub organic EL portion 122. In this case, the spacer 160 is preferably formed when forming the insulation layer of the sub organic EL display panel.

The spacer member is not limited to the above-described embodiments. Any structure capable of maintaining a gap between the main and sub organic EL display panels 110 and 120, and withstanding external force so that the main substrate 111 and the sub substrate 121 may not bend, can be adopted. For example, projections may be formed on a substrate in an area where the main or sub organic EL portions 112 or 122 are not formed.

A polarization plate (not shown) may be adhered to the outer surfaces of the main substrate 111 and the sub substrate 121.

Unlike the conventional dual-type organic EL device, the dual-type organic EL device having the above-described configuration is configured such that main and sub organic EL display panels are sealed to each other without a cap, thereby greatly reducing the overall thickness of the device. In particular, since the absorbing unit 140 is installed inside a sealed area defined by the sealing member 130, it is possible to prevent the organic layers 115 and 125 of the main and sub organic EL portions 112 and 122 from being damaged due to infiltration of external moisture. Also, since the spacer member 150, 160 is installed between the main and sub organic EL display panels 110 and 120, the structural strength against external force can be increased.

Figure 11:
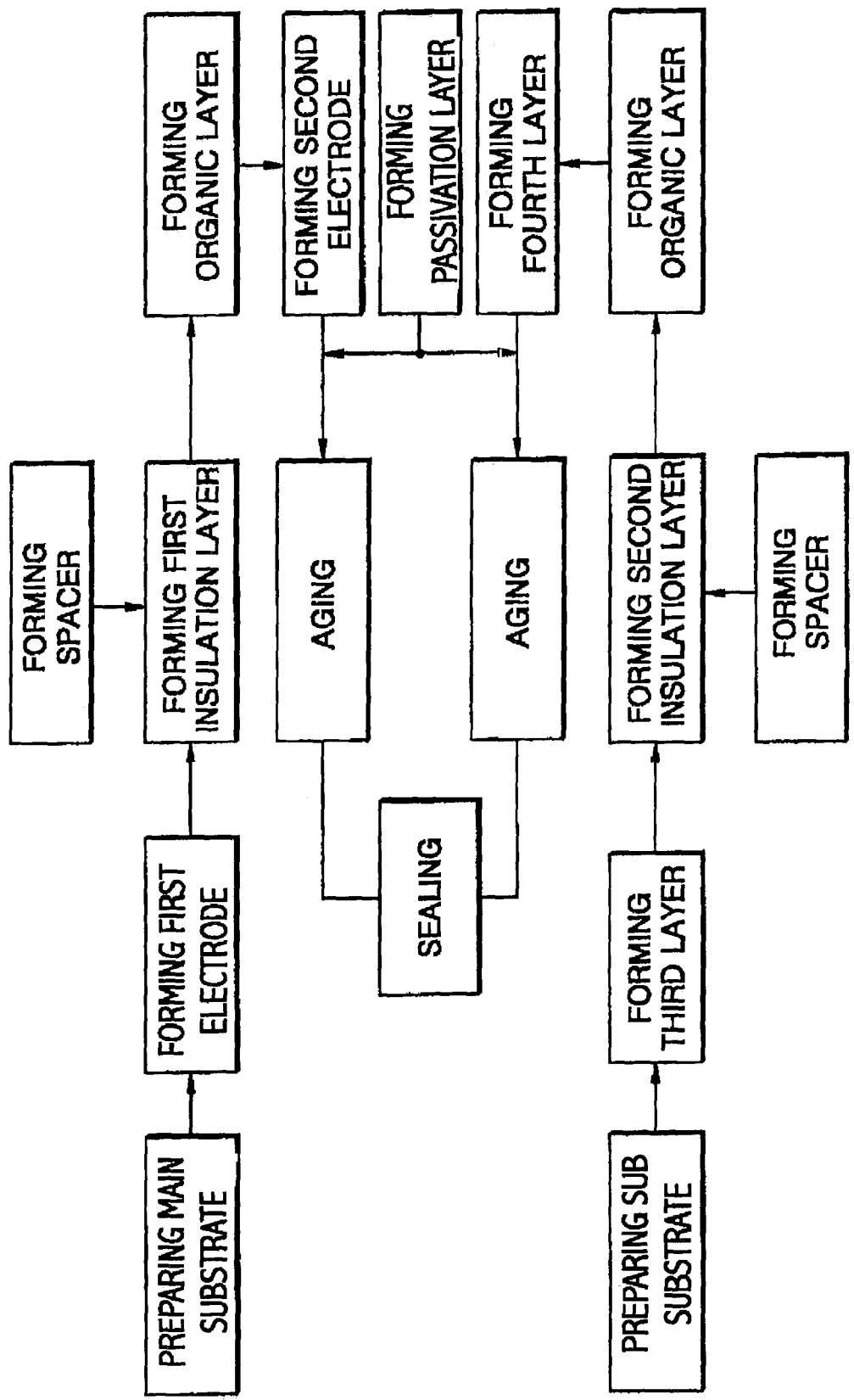
FIG. 11 is a block diagram illustrating sequential operations of a method of manufacturing a dual-type organic EL device according to an embodiment of the present invention.

A method of manufacturing the dual-type organic EL device having the above-described configuration will now be described with reference to FIG. 11.

First, a main substrate of a main organic EL display panel is prepared. The main substrate is preferably made of a transparent material, e.g., glass. A first electrode, in the shape of a strip, is formed on the top surface of the main substrate in a predetermined pattern. In this operation, the first electrode is formed by coating a transparent conductive layer, e.g., an indium tin oxide layer (ITO), onto the transparent substrate, and then performing a photolithography process using a photomask having a pattern corresponding to the first electrode for exposure, development, and etching.

Then, a first insulation layer is formed on the main substrate having the first electrode. The first insulation layer may be formed of a plurality of strips in a direction orthogonal to the first electrode by photolithography, or may be formed on the entire surface of the main substrate, exclusive of a pixel area, in a matrix type.

After forming the first insulation layer, the first organic layer is formed over the first electrode and the first insulation layer. The first organic layer forming operation includes forming a hole transport layer, forming an emitting layer, and forming an electron transport layer, the respective sub-operations being sequentially performed.

After forming the first organic layer, a second electrode shaped of a strip is formed on the top surface of the first organic layer. The second electrode may be formed by deposition of a highly conductive metal, e.g., aluminum, silver, or silver alloy.

While the main organic EL display panel is manufactured, the sub organic EL display panel is manufactured in the same manner.

After completing the manufacture of the main organic EL display panel and the sub organic EL display panel, the main organic EL display panel and the sub organic EL display panel are subjected to aging.

Thereafter, a main substrate of the main organic EL display panel and a sub substrate of the sub organic EL display panel are sealed to each other at their edges by a sealing member, thereby preventing organic EL portions of the main and sub organic EL display panels from being exposed to outside moisture.

As described above, in the manufacture of the dual-type organic EL device, the operation of forming the first or second insulation layer may further include forming a spacer member for maintaining a gap between the main substrate and the sub substrate. Also, an operation of forming passivation layers, for protecting the organic EL portions of the main and sub organic EL display panels, may be further provided.

In the operation of forming a spacer member, the spacer member projecting from the first insulation layer may be integrally formed in a non-pixel area when forming the first insulation layer of the main organic EL display panel. Likewise, the spacer member projecting from the second insulation layer may be integrally formed in a non-pixel area when forming the second insulation layer of the sub organic EL display panel.

Alternatively, in manufacturing the main and sub organic EL display panels, an absorbing unit capable of absorbing moisture may be further installed on at least one of facing surfaces thereof. The operation of installing the absorbing unit may further include forming a recess at one side of the sub substrate in the operation of preparing the sub substrate, filling the recess with an absorbent in the operation of sealing the main substrate and the sub substrate to each other, and adhering a porous tape to the sub substrate.

As described above, according to the dual-type organic EL device of these embodiments of the present invention, the first and second organic layers are protected from external moisture by sealing main and sub organic EL display panels to each other. Also, the overall thickness of the device can be reduced by making the height of a sealing member for sealing the main and sub organic EL display panels to each other as small as possible. Further, since an absorbing unit for removing moisture is installed inside a sealed area defined by the sealing member, it is possible to protect the first and second organic layers from being damaged by moisture. Since a spacer member is installed on the main substrate or the sub substrate, the structural strength of the main and sub organic EL display panels can be enhanced.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A dual-type organic electroluminescent display (EL) device comprising:
   a main organic EL display panel having a main substrate and a main organic EL portion formed on the main substrate;
   a sub organic EL display panel having a sub substrate and a sub organic EL portion formed on the sub substrate;
   a sealing member sealing the main substrate and the sub substrate to each other, wherein the main organic EL portion and the sub organic EL portion are hermetically sealed facing each other; and
   an absorbing unit preventing moisture from infiltrating into the main and sub organic EL portions, the absorbing unit provided in a sealed area defined by the sealing member.

2. The dual-type organic EL device according to claim 1, further comprising a spacer member, provided on at least one of facing surfaces of the main and sub organic EL panels, maintaining a gap between the main and sub organic EL display panels and increasing the structural strength thereof.

3. The dual-type organic EL device according to claim 2, wherein the area of the main organic EL portion is greater than that of the sub organic EL portion.

4. The dual-type organic EL device according to claim 3, wherein the spacer member is provided on the sub substrate other than the sub organic EL portion.

5. The dual-type organic EL device according to claim 2, wherein the spacer member is provided on an insulation layer of the main or sub organic EL panel.

6. The dual-type organic EL device according to claim 2, wherein the spacer member is integrally formed with an insulation layer of the main or sub organic EL panel.

7. The dual-type organic EL device according to claim 2, wherein the spacer member is one or more projections provided on a substrate in an area where the main or sub organic EL portions are not formed.

8. The dual-type organic EL device according to claim 1, wherein the absorbing unit comprises an absorbent in a recess formed in at least one portion of either the main substrate or the sub substrate in the sealed area defined by the sealing member.

9. The dual-type organic EL device according to claim 8, further comprising a porous tape preventing outflow of the absorbent, wherein the porous tape is adhered to the substrate having the recess.

10. The dual-type organic EL device according to claim 1, wherein the absorbing unit is in the shape of a sheet.

11. The dual-type organic EL device according to claim 1, wherein at least one of the main substrate and the sub substrate is made of a transparent material for transmitting light formed by the main organic EL portion.

12. The dual-type organic EL device according to claim 11, wherein the transparent material is contrast increasing dark tint glass.

13. The dual-type organic EL device according to claim 1, further comprising a polarization plate adhered to an outer surface of at least one of the main substrate and the sub substrate.

14. A dual-type organic electroluminescent display (EL) device comprising:
 a main organic EL display panel having a main substrate and a main organic EL portion formed on the main substrate;
 a sub organic EL display panel having a sub substrate and a sub organic EL portion formed on the sub substrate;
 a sealing member sealing the main substrate and the sub substrate to each other, wherein the main organic EL portion and the sub organic EL portion are hermetically sealed facing each other; and
 passivation layers covering the main organic EL portion and the sub organic EL portion, wherein the passivation layers are provided on the main substrate and the sub substrate, respectively.

15. The dual-type organic EL device according to claim 14, further comprising an absorbent sheet provided between the passivation layers.

16. The dual-type organic EL device according to claim 14, wherein the passivation layers are closely adhered to each other, and sealed by the sealing member at edges of the passivation layers.

17. The dual-type organic EL device according to claim 14, wherein the passivation layers are integrally formed, and sealed by the sealing member at edges of the passivation layers.

18. A dual-type organic electroluminescent display (EL) device comprising:
 a main organic EL display panel comprising:
  a transparent main substrate,
  a first electrode formed on the transparent main substrate in a first predetermined pattern,
  a first insulation layer pattern defining a predetermined light emitting area,
  organic layers formed over the first electrode and the first insulation layer in a predetermined pattern, and
  a second electrode having a second predetermined pattern in a direction orthogonal to the first electrode;
 a sub organic EL display panel comprising:
  a transparent sub substrate,
  a third electrode formed on the transparent sub substrate in a third predetermined pattern,
  a second insulation layer pattern defining a predetermined light emitting area,
  organic layers formed over the third electrode and the second insulation layer in a predetermined pattern, and
  a fourth electrode having a fourth predetermined pattern in a direction orthogonal to the third electrode; and
 a sealing member sealing the main substrate and the sub substrate to each other, wherein the main organic EL portion and the sub organic EL portion are hermetically sealed facing each other.

19. The dual-type organic EL device according to claim 18, further comprising a spacer member, provided on at least one of facing surfaces of the main and sub organic EL panels, maintaining a gap between the main and sub organic EL display panels and increasing the structural strength thereof.

20. The dual-type organic EL device according to claim 19, wherein the area of the main organic EL portion is greater than that of the sub organic EL portion.

21. The dual-type organic EL device according to claim 20, wherein the spacer member is provided on the sub substrate other than the sub organic EL portion.

22. The dual-type organic EL device according to claim 19, wherein the spacer member is integrally formed with at least one of the first and second insulation layers.

23. The dual-type organic EL device according to claim 18, further comprising an absorbing unit preventing moisture from infiltrating into the main and sub organic EL portions, the absorbing unit provided in a sealed area defined by the sealing member.

24. The dual-type organic EL device according to claim 23, wherein the absorbing unit comprises an absorbent in a recess formed in at least one portion of either the main substrate or the sub substrate in the sealed area defined by the sealing member.

25. The dual-type organic EL device according to claim 24, further comprising a porous tape preventing outflow of the absorbent, wherein the porous tape is adhered to the substrate having the recess.

26. The dual-type organic EL device according to claim 23, wherein the absorbing unit is in the shape of a sheet.

27. The dual-type organic EL device according to claim 18, further comprising passivation layers covering the main organic EL portion and the sub organic EL portion, wherein the passivation layers are provided on the main substrate and the sub substrate, respectively.

28. A method of manufacturing a dual-type organic EL device, the method comprising:
 preparing a main organic EL display panel, comprising:
  forming a first electrode on a transparent main substrate in a first predetermined pattern,
  forming a first insulation layer pattern defining a predetermined light emitting area,
  forming organic layers over the first electrode and the first insulation layer in a predetermined pattern, and
  forming a second electrode having a second predetermined pattern in a direction orthogonal to the first electrode;
 preparing a sub organic EL display panel; comprising:
  forming a third electrode on a transparent sub substrate in a third predetermined pattern,
  forming a second insulation layer pattern defining a predetermined light emitting area,
  forming organic layers over the third electrode and the second insulation layer in a predetermined pattern, and
  forming a fourth electrode having a fourth predetermined pattern in a direction orthogonal to the third electrode; and
 sealing the main substrate and the sub substrate to each other, wherein the main organic EL portion and the sub organic EL portion are hermetically sealed facing each other.

29. The method according to claim 28, further comprising aging the main organic EL display panel and the sub organic EL display panel.

30. The method according to claim 28, further comprising providing a spacer member on at least one of facing surfaces of the main and sub organic EL panels, the spacer member maintaining a gap between main and sub organic EL panels and increasing the structural strength of the main and sub organic EL display panels.

31. The method according to claim 28, wherein the spacer member is provided on the sub substrate other than the sub organic EL portion.

32. The method according to claim 28, further comprising providing an absorbing unit, the absorbing unit preventing moisture from infiltrating into the main and sub organic EL portions.

33. The method according to claim 32, wherein the absorbing unit is in the shape of a sheet.

34. The method according to claim 28, further comprising providing passivation layers, the passivation layers covering the main organic EL portion and the sub organic EL portion on the main substrate and the sub substrate, respectively.

* * * * *